United States Patent
Nagano

(10) Patent No.: US 7,491,945 B2
(45) Date of Patent: Feb. 17, 2009

(54) CHARGED PARTICLE BEAM APPARATUS, CHARGED PARTICLE BEAM CONTROL METHOD, SUBSTRATE INSPECTION METHOD AND METHOD OF MANUFACTURING SEMICONDUCTOR DEVICE

(75) Inventor: Osamu Nagano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 11/038,161

(22) Filed: Jan. 21, 2005

(65) Prior Publication Data

US 2005/0199827 A1 Sep. 15, 2005

(30) Foreign Application Priority Data

Jan. 21, 2004 (JP) ............... 2004-013392

(51) Int. Cl.
*G01N 23/00* (2006.01)
(52) U.S. Cl. ............... 250/396 R; 250/492.2; 250/306; 250/307; 250/311; 250/396 ML
(58) Field of Classification Search ............ 250/396 R, 250/492.1, 492.2, 492.23, 397, 398, 399, 250/396 ML, 306, 307, 308, 309, 311
See application file for complete search history.

(56) References Cited

U.S. PATENT DOCUMENTS

| 4,769,543 A | * | 9/1988 | Plies ........................ 250/310 |
| 4,808,821 A | * | 2/1989 | Feuerbaum et al. ......... 250/305 |
| 5,393,985 A | * | 2/1995 | Yamakage et al. .......... 250/398 |
| 5,614,833 A | * | 3/1997 | Golladay ................... 324/751 |
| 5,780,859 A | * | 7/1998 | Feuerbaum et al. ...... 250/396 R |
| 6,066,853 A | | 5/2000 | Nakasuji |
| 6,218,664 B1 | * | 4/2001 | Krans et al. ................ 250/310 |
| 6,376,842 B1 | | 4/2002 | Yamada |

(Continued)

FOREIGN PATENT DOCUMENTS

CN 1404617 A 3/2003

(Continued)

OTHER PUBLICATIONS

Osamu Nagano et al., "Charged Particle Beam Lithography System, Pattern Drawing Method, and Method of Manufacturing Semiconductor Device", U.S. Appl. No. 10/959,508, filed Oct. 7, 2004.

(Continued)

*Primary Examiner*—Jack I Berman
*Assistant Examiner*—Michael J Logie
(74) *Attorney, Agent, or Firm*—Finnegan, Henderson, Farabow, Garrett & Dunner, L.L.P.

(57) ABSTRACT

A charged particle beam apparatus includes: a charged particle beam generator which generates a charged particle beam; a projection optical system which generates a lens field to focus the charged particle beam on an external substrate; and deflectors arranged so as to surround an optical axis of the charged particle beam; the deflectors generating a deflection field which is superposed on the lens field to deflect the charged particle beam and to control a position to irradiate the substrate, and being configured so that intensity of the deflection field in a direction of the optical axis is changed in accordance with an angle with which the charged particle beam should fall onto the substrate.

9 Claims, 10 Drawing Sheets

U.S. PATENT DOCUMENTS

| | | | |
|---|---|---|---|
| 6,392,231 B1 | 5/2002 | Chen | |
| 6,441,384 B1 * | 8/2002 | Kojima | 250/492.23 |
| 6,452,175 B1 * | 9/2002 | Adamec | 250/310 |
| 6,512,228 B2 * | 1/2003 | Todokoro et al. | 250/310 |
| 6,593,152 B2 * | 7/2003 | Nakasuji et al. | 438/14 |
| 6,617,585 B1 * | 9/2003 | Stickel | 250/396 R |
| 6,674,075 B2 * | 1/2004 | Petrov et al. | 250/310 |
| 6,747,279 B2 | 6/2004 | Adamec | |
| 6,960,766 B2 * | 11/2005 | Chen | 250/310 |
| 7,193,221 B2 * | 3/2007 | Okumura et al. | 250/396 R |
| 2001/0010357 A1 * | 8/2001 | Ose et al. | 250/311 |
| 2002/0028399 A1 * | 3/2002 | Nakasuji et al. | 430/30 |
| 2003/0020016 A1 * | 1/2003 | Frosien | 250/310 |
| 2004/0061066 A1 * | 4/2004 | Harada et al. | 250/396 ML |
| 2005/0109955 A1 | 5/2005 | Nagano et al. | |

FOREIGN PATENT DOCUMENTS

| | | |
|---|---|---|
| JP | 6-338445 | 12/1994 |
| JP | 9-161705 | 6/1997 |
| JP | 09-213250 | 8/1997 |
| JP | 9-213250 | 8/1997 |
| JP | 2001-283760 | 10/2001 |

OTHER PUBLICATIONS

Notification of Reason for Rejection issued by the Japanese Patent Office on Dec. 19, 2006, for Japanese Patent Application No. 2004-013392, and English-language translation thereof.

T.H.P. Chang et al., "Multiple electron-beam lithography," Microelectronic Engineering (2001), 57-58, pp. 117-135.

Notification of the Third Office Action issued by the Patent Office of the People's Republic of China on Feb. 29, 2008, for Chinese Patent Application No. 2005100026356, and English-language translation thereof.

First Notification of Reason for Rejection issued by the Chinese Patent Office on Feb. 9, 2007, for Chinese Patent Application No. 200510002635.6, and English-language thereof.

\* cited by examiner

CHARGED PARTICLE BEAM APPARATUS, CHARGED PARTICLE BEAM CONTROL METHOD, SUBSTRATE INSPECTION METHOD AND METHOD OF MANUFACTURING SEMICONDUCTOR DEVICE

CROSS REFERENCE TO RELATED APPLICATION

This application claims benefit of priority under 35USC §119 to Japanese Patent Application No. 2004-013392, filed on Jan. 21, 2004, the contents of which are incorporated by reference herein.

BACKGROUND OF THE INVENTION

1. Field of the Invention

The present invention relates to a charged particle beam apparatus, a charged particle beam control method, a substrate inspection method and a method of manufacturing a semiconductor device.

2. Related Background Art

Heretofore, for a deflector used in a charged particle beam apparatus, for example, an electrostatic deflector, a quadruple or octal deflector has been generally used which comprises four or eight electrodes arranged to surround an optical axis, and positive and negative voltages are applied to the electrodes facing across the optical axis to produce an electrostatic field which controls a charged particle beam. This will be specifically described with reference to the drawings.

FIGS. 9A to 9D are sectional views showing an electrostatic deflector described in T. H. P. Chang et al, Multiple electron-beam lithography, Microelectron. Eng. 57-58 (2001) 117-135. FIG. 9A is a sectional view of a quadruple deflector 820 comprising four fan-shaped flat electrodes EL820a to EL820d, which is cut along a plane perpendicular to an optical axis Ax, and FIG. 9B is a sectional view of the deflector 820 along an X axis of FIG. 9A. Further, FIG. 9C is a sectional view of an octal deflector 822 comprising eight fan-shaped electrodes EL822a to EL822h, which is cut along a plane perpendicular to an optical axis Ax, and FIG. 9D is a sectional view of the deflector 822 along an X axis of FIG. 9C.

Describing, for example, the octal deflector 822 shown in FIG. 9C, for deflection in a forward direction (arrow direction) on the X axis, a voltage of $(\sqrt{2}-1)$ V is applied to the electrode EL822a, V to the electrode EL822b, V to the electrode EL822c, $(\sqrt{2}-1)$ V to the electrode EL822d, $-(\sqrt{2}-1)$ V to the electrode EL822e, −V to the electrode EL822f, −V to the electrode EL822g, and $-(\sqrt{2}-1)$ V to the electrode EL822h, so that a tertiary term of the electrostatic deflection field disappears to allow for a wider uniform electric field area. This enables beam deflection with significantly reduced deflection aberration.

Also, a proposal has been made to improve optical performance in an electron beam lithography apparatus using the deflectors shown in FIGS. 9A to 9D. FIG. 10 is a partial configuration diagram showing an electron beam lithography apparatus described in Japanese laid open (kokai) No. 2001-283760. In an electron beam irradiation device 900 shown in FIG. 10, an electrostatic main deflector 952 is disposed in a magnetic field of a magnetic objective lens 954, and a pre-deflector 950 is disposed on an object surface side of the objective lens 954 while a post-deflector 953 is disposed on an image surface side of the objective lens 954. The electron beam irradiation device 900 shown in FIG. 10 is used in the electron beam lithography apparatus, and widely deflects an electron beam EB on a wafer W which is a sample, in order for a faster lithography process. Therefore, a deflection system is optimized in such a manner that deflecting voltages are lowered by maintaining high deflection sensitivity and that coma aberration and an incidence angle of the electron beam EB on the wafer W will be 0. The optimization of the deflection system in the device of FIG. 10 is implemented in accordance with locations of a plurality of deflectors on the optical axis, a voltage ratio among the deflectors, and phase setting.

However, if an attempt is made to further increase the resolution of the electron beam irradiation device 900 shown in FIG. 10 or to increase the amount of deflection of the electron beam EB, more deflectors are arranged inside, in front of and in the rear of the objective lens 954, thus increasing the number of components and wires on the periphery of a pole piece of the objective lens 954. This increases the burden on mechanical assembly, and makes it difficult to produce a higher vacuum on the periphery of the pole piece due to an increase of exhaust resistance. Another problem is an increase in the number of power sources due to the increase in the number of deflectors. On the other hand, there is a limit to the actual number of deflectors and to arrangement space, which does not allow for optimal locations on a physical design, thus making it difficult to further improve performance.

SUMMARY OF THE INVENTION

According to a first aspect of the invention, there is provided a charged particle beam apparatus comprising:

a charged particle beam generator which generates a charged particle beam;

a projection optical system which generates a lens field to focus the charged particle beam on an external substrate; and deflectors arranged so as to surround an optical axis of the charged particle beam; the deflectors generating a deflection field which is superposed on the lens field to deflect the charged particle beam and to control a position to irradiate the substrate, and being configured so that an intensity of the deflection field is changed in a direction of the optical axis in accordance with an angle with which the charged particle beam should fall onto the substrate.

According to a second aspect of the invention, there is provided a charged particle beam apparatus comprising:

a charged particle beam generator which generates a charged particle beam;

a projection optical system which generates a lens field to focus the charged particle beam on an external substrate; and deflectors comprising electrodes or magnetic cores arranged to surround an optical axis of the charged particle beam; the deflectors generating a deflection field which is superposed on the lens field and deflecting the charged particle beam by the deflection field to control a position to irradiate the substrate, wherein space between surfaces of the electrodes or magnetic cores across the optical axis changes stepwise in a direction of the optical axis.

According to a third aspect of the invention, there is provided a charged particle beam apparatus comprising:

a charged particle beam generator which generates a charged particle beam;

a projection optical system which generates a lens field to focus the charged particle beam on an external substrate; and deflectors comprising electrodes or magnetic cores arranged to surround an optical axis of the charged particle beam; the deflectors generating a deflection field which is superposed on the lens field and deflecting the charged particle beam by the deflection field to control a position to irradiate the substrate, the deflectors being formed so that surfaces across the optical axis of the electrodes or magnetic cores have an angle of inclination to a direction of the optical axis and the angle of inclination changes in the optical axis direction.

According to a fourth aspect of the invention, there is provided a method of controlling a charged particle beam which is generated and applied to a substrate, the method comprising:

generating a lens field to focus the charged particle beam on the substrate; and generating a deflection field which is superposed on the lens field control a position to irradiate the substrate by deflecting the charged particle beam, the deflection field being configured so that intensity thereof in a direction of the optical axis is changed in accordance with an angle with which the charged particle beam should fall onto the substrate.

According to a fifth aspect of the invention, there is provided a substrate inspection method comprising:

generating a charged particle beam to irradiate a substrate;

generating a lens field to focus the charged particle beam on the substrate;

generating a deflection field which is superposed on the lens field to control a position to irradiate the substrate by deflecting the charged particle beam, the deflection field being configured so that intensity thereof in a direction of the optical axis is changed in accordance with an angle with which the charged particle beam should fall onto the substrate; and detecting at least one of secondary charged particles, reflected charged particles and back scattering charged particles produced from the wafer by the irradiation of the charged particle beam, in order to create a two-dimensional image representing a state in a surface of the substrate.

According to a sixth aspect of the invention, there is provided a method of manufacturing a semiconductor device comprising a substrate inspection method, the substrate inspection method including:

generating a charged particle beam to irradiate a substrate;

generating a lens field to focus the charged particle beam on the substrate;

generating a deflection field which is superposed on the lens field to deflect the charged particle beam and control a position to irradiate the substrate, the deflection field being configured so that intensity thereof in a direction of the optical axis is changed in accordance with an angle with which the charged particle beam should fall onto the substrate; and detecting at least one of secondary charged particles, reflected charged particles and back scattering charged particles produced from the wafer by the irradiation of the charged particle beam, in order to create a two-dimensional image representing a state in a surface of the substrate.

DETAILED DESCRIPTION OF THE INVENTION

Several embodiments of the present invention will hereinafter be described in reference to the drawings. In the following embodiments, an electron beam lithography apparatus will be described which uses an electron beam as a charged particle beam to draw patterns on a wafer.

Figure 1:
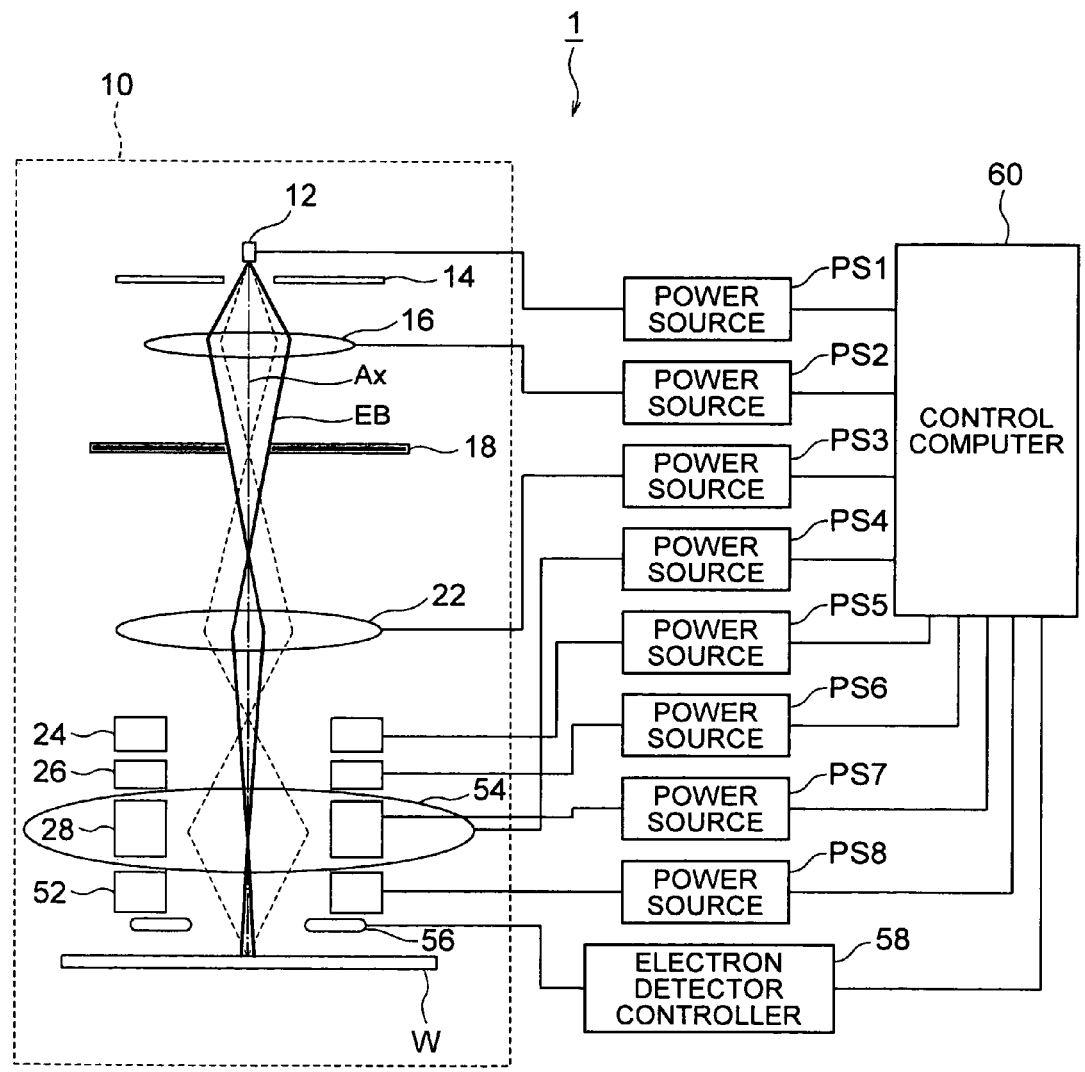
FIG. 1 is a block diagram showing a schematic configuration in one embodiment of a charged particle beam apparatus according to the present invention.

FIG. 1 is a block diagram showing a schematic configuration of one embodiment of a charged particle beam apparatus according to the present invention. An electron beam lithography apparatus 1 shown in FIG. 1 comprises an electron beam column 10, power sources PS1 to PS8, an electron beam detector 56, an electron detector controller 58, and a control computer 60 to control the entire apparatus.

The electron beam column 10 includes an electron gun 12, an aperture 14, an illumination lens 16, a forming aperture 18, a reduction lens 22, a pre-main deflector 24, a sub deflector 26, a main deflector 28 characterizing the present embodiment, and a post-main deflector 52. The electron gun 12 generates and accelerates an electron beam EB to irradiate a wafer W which is a sample. The aperture 14 has a rectangular or round opening, which defines a sectional shape of the electron beam EB. The forming aperture 18 has an opening with a shape corresponding to a desired pattern. The illumination lens 16 adjusts magnification so that the electron beam EB has a desired beam diameter. The reduction lens 22 reduces the beam diameter of the electron beam EB. An objective lens 54 has its focal distance adjusted so that the electron beam EB is imaged on an upper surface of the wafer W. The pre-main deflector 24, the main deflector 28, the post-main deflector 52 and the sub deflector 26 control the irradiation position of the electron beam EB on the wafer W. In the present embodiment, the objective lens 54 comprises a magnetic lens, the reduction lens 22 comprises an electrostatic lens, and the pre-main deflector 24, the main deflector 28, the post-main deflector 52 and the sub deflector 26 are all electrostatic deflectors. The pre-main deflector 24, the main deflector 28 and the post-main deflector 52 are controlled so that a drawing area (main deflection area) is scanned with the electron beam EB referring to a position of an XY stage with regard to the wafer W mounted on the unshown XY stage, and the sub deflector 26 controls the irradiation position of the electron beam EB so that drawing is performed in sub deflection areas subdivided from the main deflection area.

Operations of elements in the electron beam column 10 are as follows.

The electron beam EB generated and accelerated by the electron gun 12 irradiates the aperture 14. The electron beam EB which has passed through the aperture 14 moves toward the forming aperture 18. The electron beam EB has its magnification adjusted by the illumination lens 16 to have a beam diameter which is sufficiently large and is as large as required for the opening of the forming aperture 18. The electron beam EB starts as a pattern beam originating from the forming aperture 18, and is reduced at the reduction lens 22, and then passes through the electrostatic pre-main deflector 24, the sub deflector 26, the main deflector 28 and the post-main deflector 52 so that its irradiation position is adjusted, whereby the electron beam EB is projected on the upper surface of the wafer W just in focus by the magnetic objective lens 54.

The power sources PS1 to PS8 are connected to the control computer 60, and also connected to the electron gun 12, the illumination lens 16, the reduction lens 22, the objective lens 54, the pre-main deflector 24, the sub deflector 26, the main deflector 28 and the post-main deflector 52, respectively, and the power sources PS1 to PS8 apply, to the elements connected to, voltages whose values are controlled in accordance with command signals supplied from the control computer 60.

The electron beam detector 56 is disposed between the post-main deflector 52 and the wafer W, and detects at least one of a secondary electron, a reflected electron and a back scattering electron produced on the wafer W by the irradiation of the electron beam EB and supplies a detection signal to the electron detector controller 58. The electron detector controller 58 processes the detection signal from the electron beam detector 56 to supply the control computer 60 with an image signal which is to be a two-dimensional electron image (SEM image) representing the state in the surface of the wafer W. On the basis of this image signal the control computer 60 makes adjustments such as focusing of the electron beam EB.

The electron beam EB is, in the objective lens 54, subjected to lens force (Lorentz force) from a magnetic field excited by the objective lens 54, and thus changes its trajectory. If the electrostatic deflector is disposed in the magnetic field of the objective lens 54 to produce an electrostatic field, the trajectory of the electron beam EB is further changed under the lens force by the magnetic field and deflecting force by the electrostatic field at the same time. This trajectory form greatly affects deflection aberration on the wafer W and the irradiation angle of the electron beam EB to the wafer W. By producing an electrostatic deflection field in accordance with magnetic field distribution of the objective lens 54, deflection sensitivity can be further increased and the deflection aberration can be further reduced. Moreover, the incidence angle to the wafer W can be controlled such that the electron beam EB falls on the wafer W substantially perpendicularly thereto, and it is thus possible to minimize displacement of a drawing position and/or a change in a pattern shape each of which is caused by a slight change in distance between the wafer W and the objective lens 54.

The main deflector 28 disposed in the magnetic field of the objective lens 54 in FIG. 1 is configured so as to be able to form desired electrostatic deflection field distribution in an optical axis direction. Thus, intensity of a deflection field superposed on a lens field of the objective lens 54 changes in the direction of its optical axis Ax so that the electron beam EB falls on the wafer W at a desired incidence angle while the deflection aberration is reduced.

Some of the specific configurations of the main deflector 28 will be described referring to FIGS. 2A to 5B. FIGS. 2B to 4B respectively show sectional views of main deflectors 282, 284, 290, 292, 294, 302, 304 along the optical axis direction of the electron beam EB, in a similar manner to FIGS. 9B and 9D. Sections perpendicular to the optical axis directions of the main deflectors 282 to 306 respectively shown in FIGS. 2B to 4B and 8A are the same as those of deflectors 820, 822 shown in FIGS. 9A, 9C and FIGS. 9B and 9D.

Figure 2A:
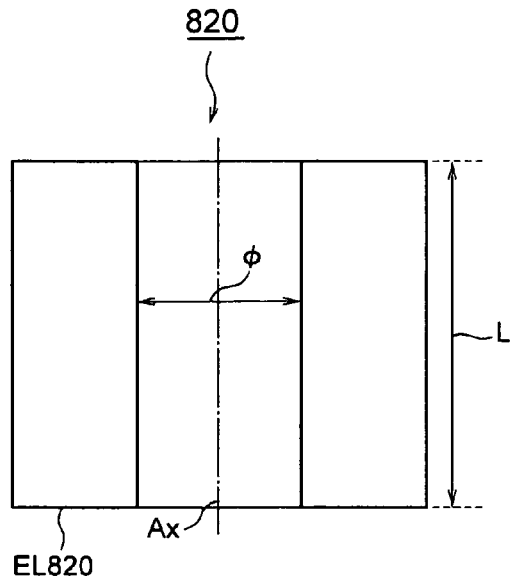
FIG. 2A is a sectional view showing one example of a deflector according to prior art.
Figure 2B:
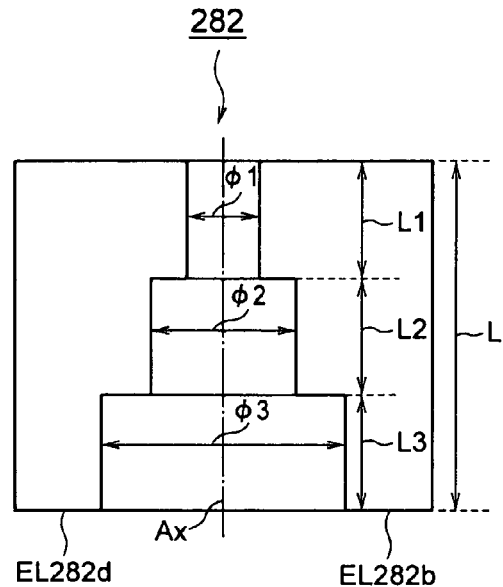
FIGS. 2B and 2C are sectional views showing specific examples of main deflectors formed in such a manner that electrode surfaces on an optical axis side have three steps along an optical axis.
Figure 2C:
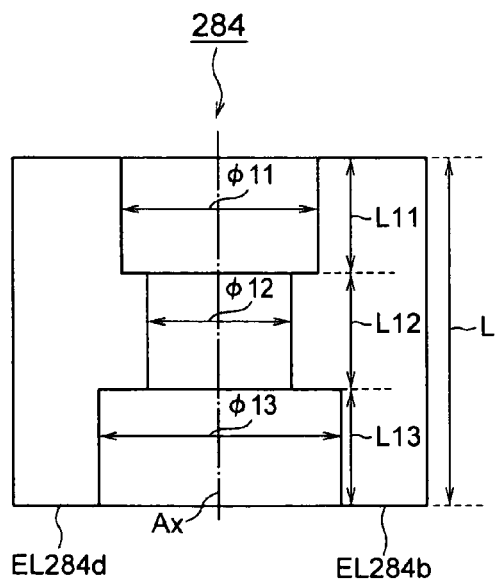

The main deflectors 282, 284 shown in FIGS. 2B and 2C are formed in such a manner that electrode surfaces on the side of the optical axis Ax have three steps along the optical axis. In the main deflector 282 of FIG. 2B, electrodes EL282$b$, EL282$d$ facing each other across the optical axis Ax comprise three steps having lengths L1, L2, L3 when viewed from an object surface side in the direction of the optical axis Ax, and are formed so that a distance $\Phi1$, $\Phi2$, $\Phi3$ between the electrodes is greater in the step closer to the wafer W (image surface side). Further, in the main deflector 284 of FIG. 2C, electrodes EL284$b$, EL284$d$ facing each other across the optical axis Ax comprise three steps having lengths L11, L12, L13 in the direction of the optical axis Ax when viewed from an object surface side, and are formed so that an interelectrode distance $\Phi11$ in the step on the object surface side is larger than an interelectrode distance $\Phi12$ in the middle step and so that an interelectrode distance $\Phi13$ in the step on the image surface side is the largest. For easier comparison with a conventional deflector, the deflector 820 shown in FIG. 9A is again shown in FIG. 2A.

Figure 3A:
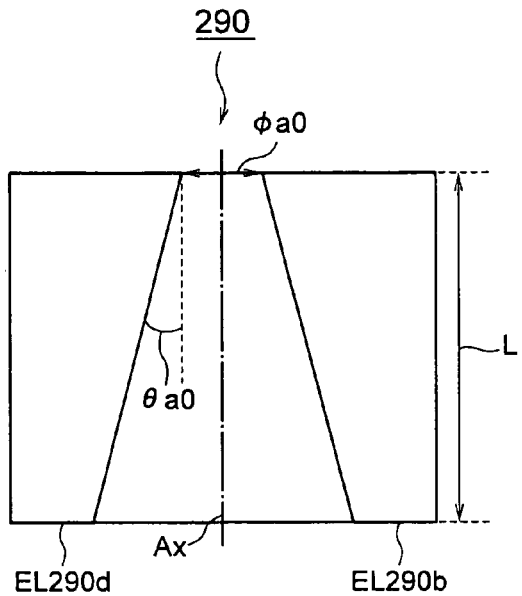
FIGS. 3A to 3C are sectional views showing specific examples of the main deflectors in which the electrode surfaces on the optical axis side are inclined.
Figure 3B:
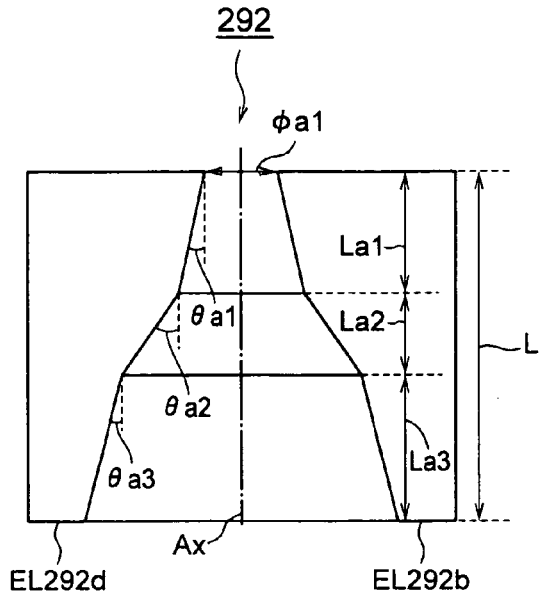
Figure 3C:
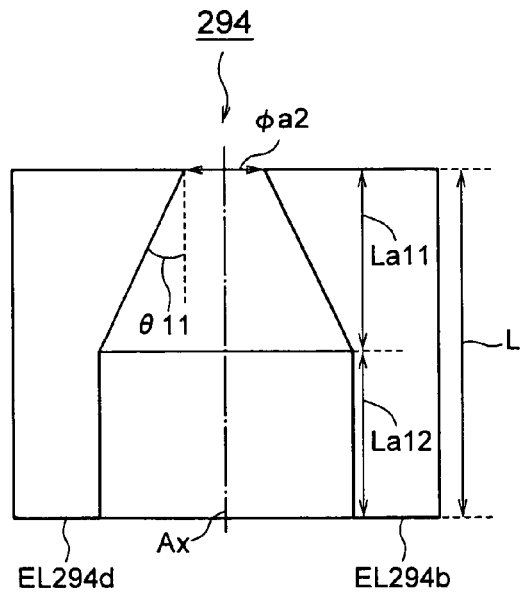

The main deflectors 290, 292, 294 shown in FIGS. 3A to 3C have inclined electrode surfaces on the side of the optical axis Ax. In the main deflector 290 shown in FIG. 3A, electrodes EL290$b$, EL29$d$ are arranged so as to have an interelectrode distance $\Phi a0$ at the upper surfaces, and are formed so that the electrode surface on the optical axis side is inclined at an angle $\theta a0$ to the optical axis direction. In the main deflector 292 of FIG. 3B, electrodes EL292$b$, EL292$d$ are arranged so as to have an interelectrode distance $\Phi a1$ at the upper surfaces, and are formed so that the electrode surface on the optical axis side is variably angled at $\theta a1$, $\theta a2$, $\theta a3$ to the optical axis Ax along with lengths La1, La2, La3 in the optical axis direction when viewed from the object surface side. Moreover, in the main deflector 294 shown in FIG. 3C, electrodes EL294$b$, EL294$d$ are arranged to have an interelectrode distance $\Phi a2$ at the upper surfaces, and have inclined surfaces angled at $\theta a11$ to the optical axis Ax up to a portion having a length La11 from the object surface side, but the remainder on the image surface side (portion beyond the length La11 from the object surface side in the optical axis direction) are formed to be parallel with the optical axis.

Figure 4A:
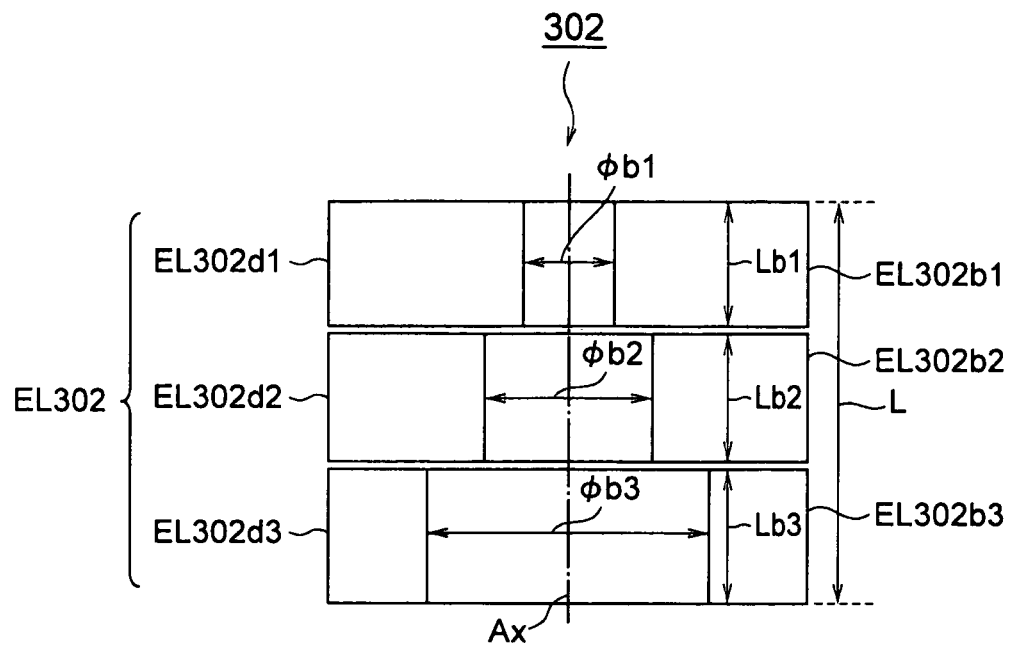
FIGS. 4A and 4B are sectional views showing specific examples of the main deflectors divided in an optical axis direction to configure a three-stage deflector.

The main deflector 302 shown in FIG. 4A is configured in such a form that the main deflector 282 shown in FIG. 2B is divided along planes each intersecting the boundaries of three steps, wherein electrodes EL302$b$1, EL302$d$1 at the upper step (object surface side) have a length Lb1 in the direction of the optical axis Ax and are arranged so that the electrode surfaces on the optical axis side are separate from each other at a distance $\Phi b1$ and wherein electrodes EL302$b$2, EL302$d$2 at the middle step have a length Lb2 in the direction of the optical axis Ax and are arranged so that the electrode surfaces on the optical axis side are separate from each other at a distance $\Phi b2$ and wherein electrodes EL302$b$3, EL302$d$3 at the lower step (image surface side) have a length Lb3 in the direction of the optical axis Ax and are arranged so that the electrode surfaces on the optical axis side are separate from each other at a distance $\Phi b3$.

Figure 4B:
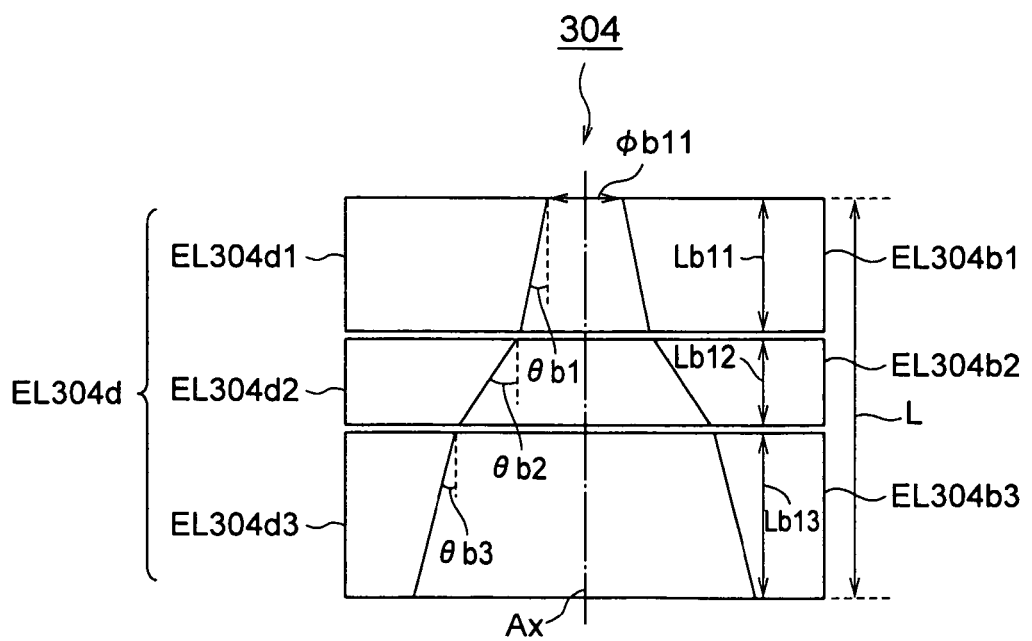

The main deflector 304 shown in FIG. 4B is configured in such a form that the main deflector 292 shown in FIG. 3B is divided along planes each intersecting boundaries of the three-stepped portions with different angles of inclination, wherein electrodes EL304$b$1, EL304$d$1 at the upper step (object surface side) have a length Lb11 in the direction of the optical axis Ax and electrodes EL304$b$2, EL304$d$2 at the middle step have a length Lb12 in the direction of the optical axis Ax and electrodes EL304$b$3, EL304$d$3 at the lower step (image surface side) have a length Lb13 in the direction of the optical axis Ax. The electrodes EL304$b$1, EL304$d$1 at the upper step are arranged so that the upper surfaces thereof are separate from each other at a distance Φb11. Further, the electrode surfaces on the optical axis side of the electrodes EL304$b$1, EL304$d$1 at the upper step are inclined at an angle θb1 to the direction of the optical axis Ax, and the electrode surfaces on the optical axis side of the electrodes EL304$b$2, EL304$d$2 at the middle step are inclined at an angle θb2 to the direction of the optical axis Ax, and the electrode surfaces on the optical axis side of the electrodes EL304$b$3, EL304$d$3 at the lower step are inclined at an angle θb3 to the direction of the optical axis Ax.

Figures 5A, 5B:
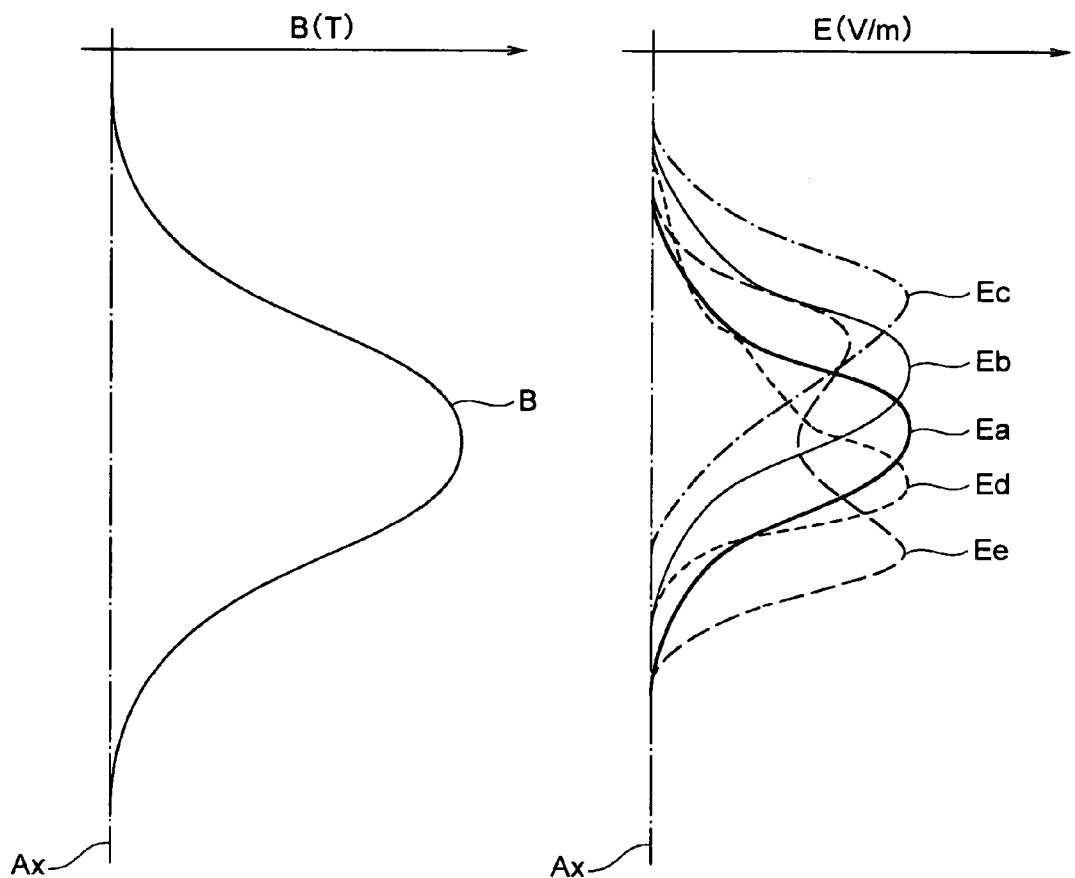
FIGS. 5A and 5B are diagrams showing distribution diagrams of a magnetic field of an objective lens and electrostatic fields of the main deflectors.
Figure 6:
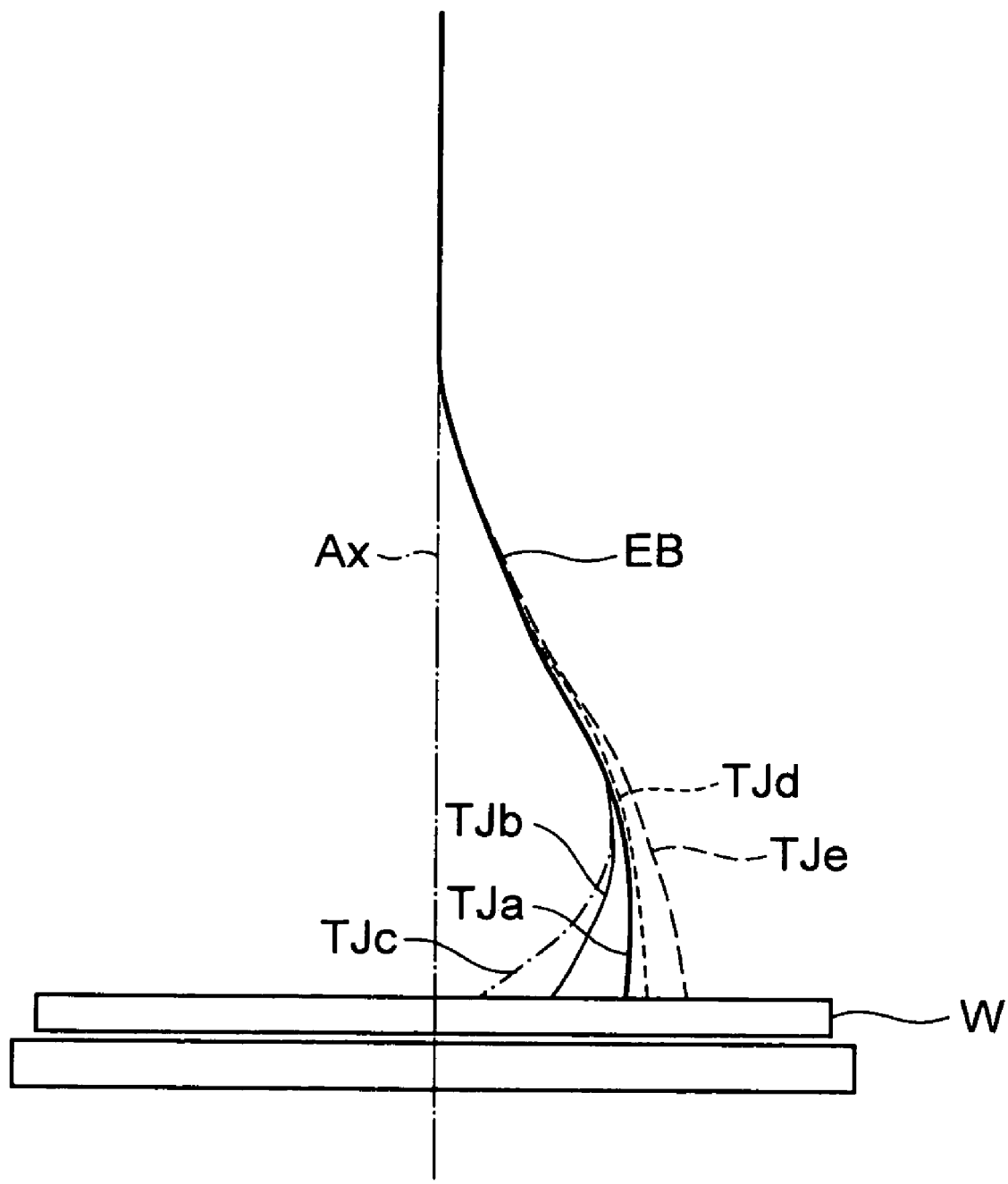
FIG. 6 is a diagram explaining the relationship between changes in the distribution of the electrostatic fields of the main deflectors and an electron beam trajectory.

In the various main deflectors described above, the distribution shape of the deflection electric field can be changed by adjusting the length in the optical axis direction, the distance between the electrode surfaces on the optical axis side, or the angle to the optical axis direction in the electrode surface on the optical axis side, and as a result, the incidence angle of the electron beam EB to the wafer W can be controlled for an arbitrary angle. This will be specifically described using distribution diagrams of a magnetic field and electric fields in FIGS. 5A and 5B and an electron beam trajectory diagram of FIG. 6. Describing the main deflector 282 shown in FIG. 2B as an example, by adjusting the distances Φ1, Φ2, Φ3 between the electrodes facing each other across the optical axis Ax and the lengths L1, L2, L3 of the respective steps in the optical axis direction, the distribution shape of the electrostatic deflection field can be changed into Ea to Ee as shown in FIG. 5B, with respect to an objective lens magnetic field B in the direction along the optical axis Ax as shown in FIG. 5A. The distribution of the electrostatic deflection field superposed on the lens field of the objective lens is changed as in Ea to Ee shown in FIG. 5B, such that the trajectory of the electron beam EB is changed as shown by signs TJa to Tje of FIG. 6, respectively.

Figure 7A:
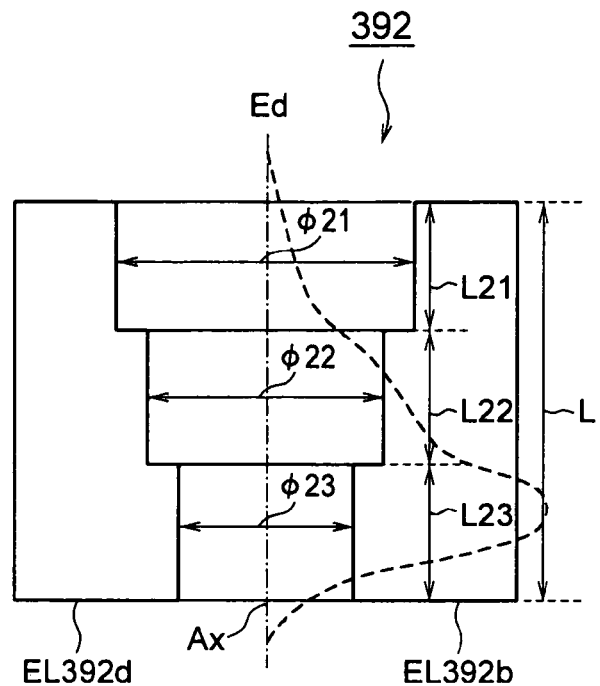
FIGS. 7A and 7B are sectional views showing specific examples of the main deflectors which generate electrostatic fields Ed and Ee shown in FIG. 5B.
Figure 7B:
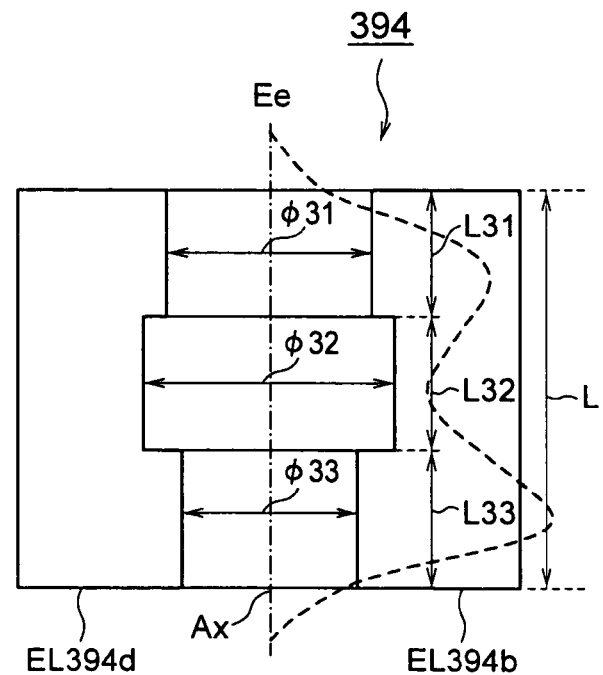

Configuration examples of the deflector to form Ed and Ee among the five distributions of the electric fields shown in FIG. 5B are shown in FIGS. 7A and 7B. Each of deflectors 392 and 394 shown in these drawings is formed with one electrode in which the electrode surface of the optical axis side is formed in a stepped shape.

Furthermore, in the case of the main deflector 292 having the inclined electrode surface shown in FIG. 3B, the distribution of the deflection field can be changed similarly to the case of the main deflector 282 described above, by adjusting the distance Φa1 between the electrodes of the main deflector, the inclination angles θa1, θa2, θa3 to the optical axis Ax and the lengths La1, La2, La3 in the optical axis direction. Moreover, even when the main deflectors 302, 304 of FIGS. 4A and 4B with the divided electrode are used, the three-stepped electrodes (EL302$b$1, EL302$b$2, EL302$b$3 if the main deflector 302 is taken as an example) divided in the direction of the optical axis Ax can be controlled with the same power source, if adjustments are made for the distance between the deflection electrodes (Φb1, Φb2, Φb3), the lengths between the electrodes (Lb1, Lb2, Lb3, Lb11, Lb12, Lb13) and the inclination angles of the electrode surface (θb1, θb2, θb3).

Figure 8A:
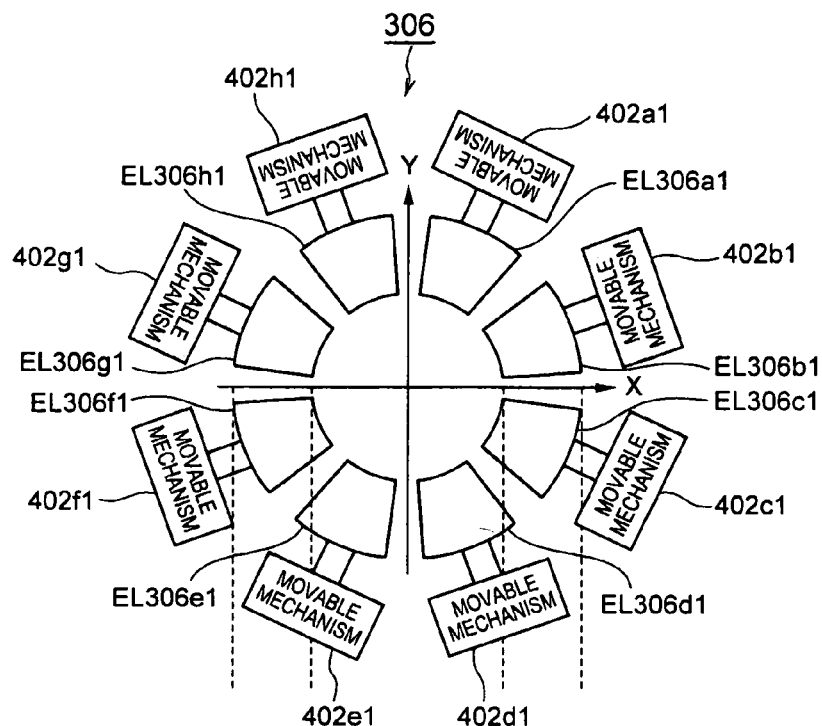
FIGS. 8A to 8C are diagrams showing specific examples of a deflector having movable mechanisms coupled to electrodes.
Figure 8B:
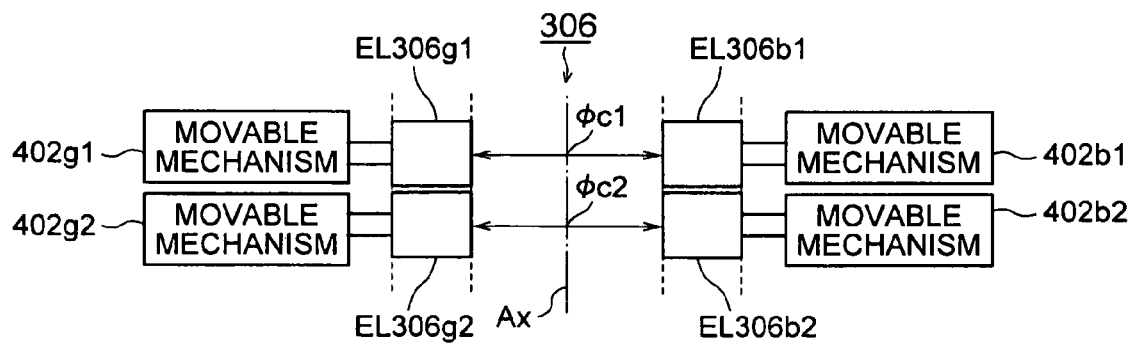
Figure 8C:
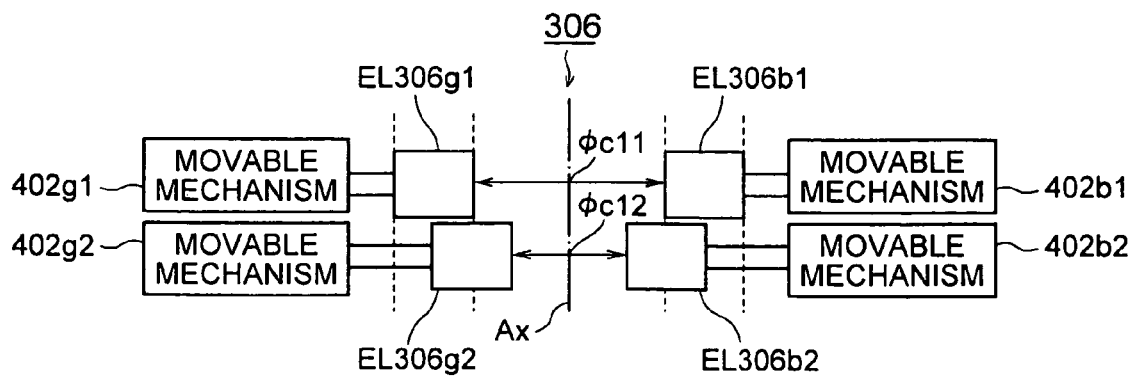
Figure 9A:
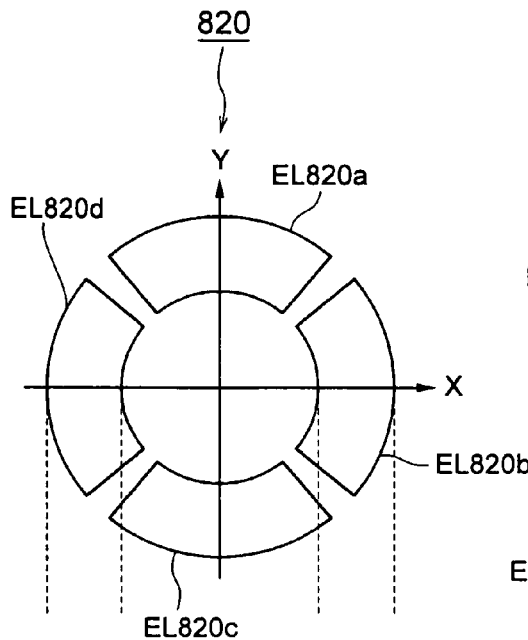
FIGS. 9A to 9D are sectional views showing one example of deflectors according to prior art.
Figure 9C:
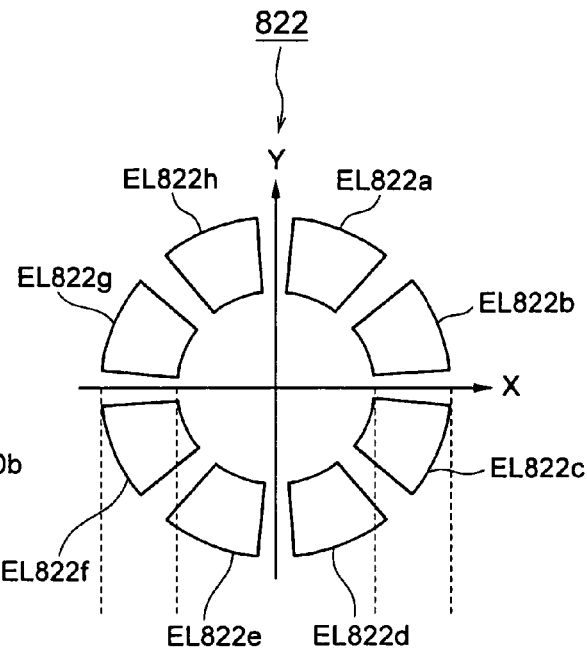
Figure 9B:
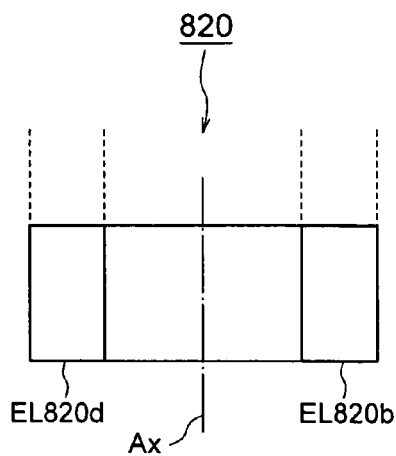
Figure 9D:
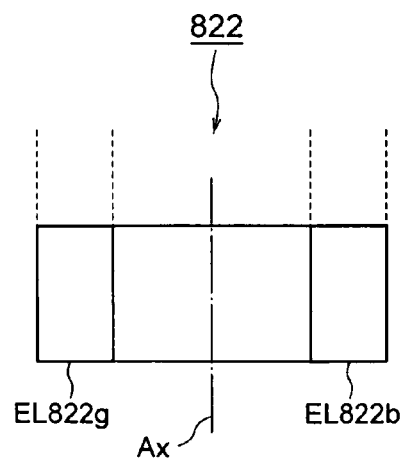
Figure 10:
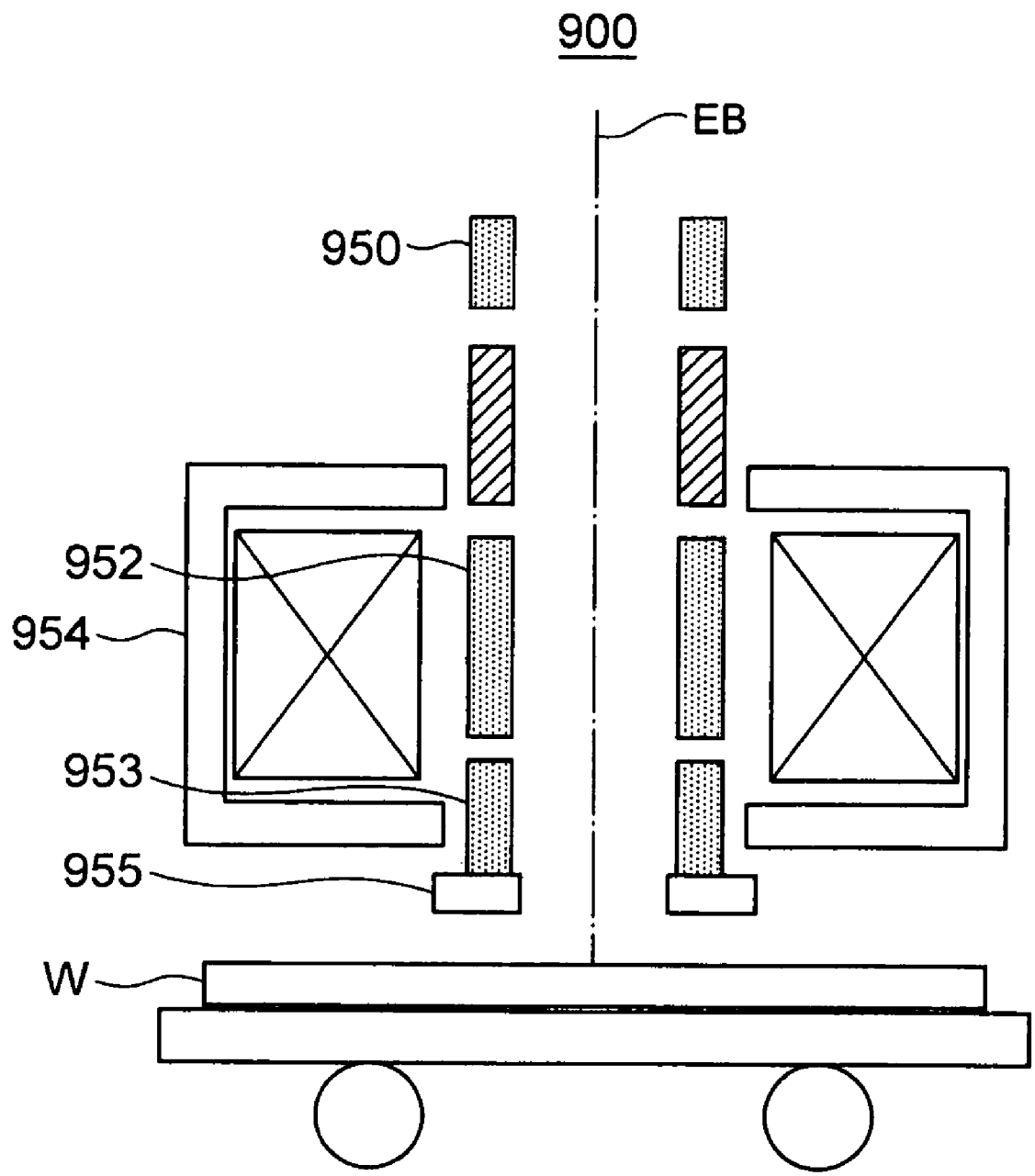
FIG. 10 is a partial configuration diagram showing one example of an electron beam lithography apparatus according to prior art.

Furthermore, as shown in FIG. 8A, the (multistep) main deflector 306 multi-divided in the direction of the optical axis Ax is used and movable mechanisms EL402$a$1 to EL402$h$1, EL402$a$2 to EL402$h$2 respectively connected to electrodes (EL306$a$1 to EL306$h$1, EL306$a$2 to EL306$h$2) are provided, such that, for example, an inside diameter (distance between optical axis side surfaces of the opposite electrodes) of the main deflector can be adjusted from Φc2 (see FIG. 8B) to Φc12 (see FIG. 8C) to create a desired distribution of deflection electric field in the optical axis direction.

The incidence angle of the electron beam EB to the wafer W is preferably perpendicular in exposure devices, but a greater incidence angle to the optical axis may be preferable in other fields such as electron microscopes, in which case the angle can naturally be controlled by the shape of the deflector.

Particularly, because the irradiation angle of the electron beam to a sample can be freely changed using the main deflector shown in FIG. 8A, it is possible to acquire, with high resolution, both an SEM image (top-down image) from above the wafer W which can be obtained by perpendicular incidence of the electron beam EB onto the wafer W, and an SEM image (inclined image) obliquely from above the wafer W which can be obtained by oblique incidence of the electron beam EB onto the wafer W. Further, it is also possible to obtain three-dimensional shape using right and left inclined images.

In this way, according to the present embodiment, intensity distribution of the deflection field superposed on the lens field of the objective lens can be arbitrarily changed. Further, even when mechanical locations of the deflectors in the direction along the optical axis can not be moved due to lack or absence of space resulting from mechanical arrangement, a deflection point can be moved by changing the electrode shape, thereby making it possible to optimize a deflection system.

Furthermore, by using the above-described electron beam apparatus in manufacturing processes of semiconductor devices, patterns can be drawn or inspected with high resolution while the deflection aberration on the wafer W is reduced, thus enabling the manufacture of semiconductor devices with a higher yield ratio.

While the embodiments of the present invention have been described above, the present invention is not at all limited to the above embodiments, and various modifications can naturally be made within the scope thereof.

For example, the electrostatic deflector has been used as the deflector for a charged particle beam in the embodiments described above, but the present invention is limited thereto, and a magnetic deflector may be used. When the magnetic deflector is used, ferrite may be used as magnetic cores instead of, for example, the electrodes described in FIGS. 2B to 4B.

Furthermore, while the exposure apparatus using the electron beam as the charged particle beam has been described, the present invention can naturally be applied to all the charged particle beam apparatuses as long as they use the deflectors.

What is claimed is:

1. A charged particle beam apparatus comprising: a charged particle beam generator which generates a charged particle beam; a projection optical system which generates a lens field to focus the charged particle beam on an external substrate; and a single stage deflector arranged so as to surround an optical axis of the charged particle beam, the deflector generating a deflection field which is superposed on the lens field to deflect the charged particle beam and to control a position to irradiate the substrate, the deflector, comprising a pair of opposed electrodes, being configured so that space between surfaces of the opposed electrodes across the optical axis changes stepwise in a direction of the optical axis and an intensity of the deflection field is changed in a direction of the optical axis in accordance with an angle with which the charged particle beam should fall onto the substrate.

2. A charged particle beam apparatus comprising: a charged particle beam generator which generates a charged particle beam; a projection optical system which generates a lens field to focus the charged particle beam on an external substrate; and a single stage deflector arranged so as to surround an optical axis of the charged particle beam, the deflector generating a deflection field which is superposed on the lens field to deflect the charged particle beam and to control a position to irradiate the substrate, the deflector being formed so that surfaces across the optical axis thereof have an angle of inclination tapering in a direction of the optical axis from an image surface side to an object surface side and an intensity of the deflection field is changed in a direction of the optical axis in accordance with an angle with which the charged particle beam should fall onto the substrate.

3. The charged particle beam apparatus according to claim 2, wherein the angle of inclination changes in the optical axis direction.

4. A method of controlling a charged particle beam which is generated and applied to a substrate, the method comprising: generating a lens field to focus the charged particle beam on the substrate; and generating a deflection field which is superposed on the lens field with the use of a single stage deflector to control a position to irradiate the substrate by deflecting the charged particle beam, the deflector, comprising a pair of opposed electrodes, being configured so that space between surfaces of the opposed electrodes across the optical axis changes stepwise in a direction of the optical axis and the deflection field being configured so that intensity thereof in a direction of the optical axis is changed in accordance with an angle with which the charged particle beam should fall onto the substrate.

5. A substrate inspection method comprising: generating a charged particle beam to irradiate a substrate; generating a lens field to focus the charged particle beam on the substrate; generating a deflection field which is superposed on the lens field with the use of a single stage deflector arranged so as to surround an optical axis of the charged particle beam to control a position to irradiate the substrate by deflecting the charged particle beam, the deflector, comprising a pair of opposed electrodes, being configured so that space between surfaces of the opposed electrodes across the optical axis changes stepwise in a direction of the optical axis and the deflection field being configured so that intensity thereof in a direction of the optical axis is changed in accordance with an angle with which the charged particle beam should fall onto the substrate; and detecting at least one of secondary charged particles, reflected charged particles and back scattering charged particles produced from the wafer by the irradiation of the charged particle beam, in order to create a two-dimensional image representing a state in a surface of the substrate.

6. A method of manufacturing a semiconductor device comprising a substrate inspection method, the substrate inspection method including: generating a charged particle beam to irradiate a substrate; generating a lens field to focus the charged particle beam on the substrate; generating a deflection field which is superposed on the lens field with the use of a single stage deflector to deflect the charged particle beam and control a position to irradiate the substrate, the deflector, comprising a pair of opposed electrodes, being configured so that space between surfaces of the opposed electrodes across the optical axis changes stepwise in a direction of the optical axis and the deflection field being configured so that intensity thereof in a direction of the optical axis is changed in accordance with an angle with which the charged particle beam should fall onto the substrate; and detecting at least one of secondary charged particles, reflected charged particles and back scattering charged particles produced from the wafer by the irradiation of the charged particle beam, in order to create a two-dimensional image representing a state in a surface of the substrate.

7. A method of controlling a charged particle beam which is generated and applied to a substrate, the method comprising: generating a lens field to focus the charged particle beam on the substrate; and generating a deflection field which is superposed on the lens field with the use of a single stage deflector to control a position to irradiate the substrate by deflecting the charged particle beam, the deflector being formed so that surfaces thereof across the optical axis have an angle of inclination tapering in a direction of the optical axis from an image surface side to an object surface side and the deflection field being configured so that intensity thereof in a direction of the optical axis is changed in accordance with an angle with which the charged particle beam should fall onto the substrate.

8. A substrate inspection method comprising: generating a charged particle beam to irradiate a substrate; generating a lens field to focus the charged particle beam on the substrate; generating a deflection field which is superposed on the lens field with the use of a single stage deflector arranged so as to surround an optical axis of the charged particle beam to control a position to irradiate the substrate by deflecting the charged particle beam, the deflector being formed so that surfaces thereof across the optical axis have an angle of inclination tapering in a direction of the optical axis from an image surface side to an object surface side and the deflection field being configured so that intensity thereof in a direction of the optical axis is changed in accordance with an angle with which the charged particle beam should fall onto the substrate; and detecting at least one of secondary charged particles, reflected charged particles and back scattering particles produced from the wafer by the irradiation of the charged, particle beam, in order to create a two-dimensional image representing a state in a surface of the substrate.

9. A method of manufacturing a semiconductor device comprising a substrate inspection method, the substrate inspection method including: generating a charged a charged particle beam to irradiate a substrate; generating a lens field to focus the charged particle beam on the substrate; generating a deflection field which is superposed on the lens field with the use of a single stage deflector to deflect the charged particle beam and control a position to irradiate the substrate, the deflector being formed so that surfaces thereof across the optical axis have an angle of inclination tapering in a direction of the optical axis from an image surface side to an object surface side and the deflection field being configured so that intensity thereof in a direction of the optical axis is changed in accordance with an angle with which the charged particle beam should fall onto the substrate; and detecting at least one of secondary charged particles, reflected charged particles and back scattering charged particles produced from the wafer by the irradiation of the charged particle beam, in order to create a two-dimensional image representing a state in a surface of the substrate.

* * * * *